United States Patent
Mizumoto et al.

(10) Patent No.: US 6,228,509 B1
(45) Date of Patent: May 8, 2001

(54) ELECTROMAGNETIC WAVE SHIELDING SHEET

(75) Inventors: Yasuharu Mizumoto; Tomoyuki Nakada; Toshiaki Suzuki, all of Shizuoka (JP)

(73) Assignee: Tomoegawa Paper Co., Ltd, Tokyo (JP)

(*) Notice: Subject to any disclaimer, the term of this patent is extended or adjusted under 35 U.S.C. 154(b) by 0 days.

(21) Appl. No.: 09/238,167

(22) Filed: Jan. 28, 1999

(30) Foreign Application Priority Data

Jan. 30, 1998 (JP) .................................................. 10-018354

(51) Int. Cl.⁷ ................................ H05K 9/00; B32B 5/16
(52) U.S. Cl. ...................... 428/605; 428/613; 174/35 MS
(58) Field of Search ..................................... 428/605, 608, 428/606, 613; 174/35 MS

(56) References Cited

U.S. PATENT DOCUMENTS

| | | | |
|---|---|---|---|
| 4,689,098 | * 8/1987 | Van De Velde et al. | 428/606 |
| 4,703,898 | * 11/1987 | Nakagawa et al. | 241/30 |
| 4,749,625 | * 6/1988 | Obayashi et al. | 428/624 |
| 4,992,329 | * 2/1991 | Ishii et al. | 174/35 MS |
| 5,226,210 | * 7/1993 | Koskenmaki et al. | 174/35 MS |
| 6,045,926 | * 4/2000 | Van De Velde et al. | 428/606 |

FOREIGN PATENT DOCUMENTS

| | | | |
|---|---|---|---|
| 3-191598 | * 8/1991 | (JP) | . |
| 4-153399 | * 5/1992 | (JP) | . |
| 4-337007 | * 11/1992 | (JP) | . |
| 5-230799 | * 9/1993 | (JP) | . |
| 6-93305 | * 4/1994 | (JP) | . |
| 7-258706 | * 10/1995 | (JP) | . |
| 7-97602 | * 11/1995 | (JP) | . |
| 9-308986 | * 12/1997 | (JP) | . |

* cited by examiner

Primary Examiner—John J. Zimmerman
(74) Attorney, Agent, or Firm—McDermott, Will & Emery

(57) ABSTRACT

The present invention provides a thin and flexible electromagnetic wave shielding material having excellent electromagnetic wave shielding properties and mainly usable in electronic equipment. The electromagnetic wave shielding sheet according to the present invention is composed of a porous sheet containing one or plural kinds of metallic fibers, or a sintered porous sheet obtained by sintering the above porous sheet. The sheet has a thickness of 10 to 100 μm, a porosity of 70 to 95% and Gurley stiffness of 5 to 50 mg. The sheet can be made by, for example, using stainless steel fiber as the metallic fiber in accordance with a wet paper making process.

3 Claims, 1 Drawing Sheet

ELECTROMAGNETIC WAVE SHIELDING SHEET

BACKGROUND OF THE INVENTION

1. Field of the Invention

The present invention relates to an electromagnetic wave shielding sheet, and particularly to an electromagnetic wave shielding sheet suitable for use in electronic parts, circuit boards, flexible printed circuit boards (FPCs) and the like.

2. Description of the Related Art

With miniaturization of electronic equipment requiring higher density assembly, high integration, and lighter electronic equipment, damage by electromagnetic waves from electronic parts and/or electronic equipment has become a problem. In order to avoid the problem, various preventive measures have been taken. In order to shield an object from electromagnetic waves, the object is shielded with a metallic material. Examples of metallic materials used for this purpose include metal plates, wire gauzes, metallic leaves or foils (hereinafter referred to as metallic leaf), platings, deposited metals and metal-containing paints. They are properly used as necessary for the end application intended. Electromagnetic wave shielding properties generally become better as the volume resistivity of a shielding material is lower, and its thickness is greater. However, the prior art methods for shielding are limited by size, price, performance, processability and the like according to its application.

However, because of the present rapid progress of electronic technologies to make electronic parts smaller and lighter in weight, electromagnetic wave shielding materials used in these electronic parts must be made thinner, for example, by changing from a metal plate to a wire gauze or metallic leaf. For example, in a flexible printed circuit board, an electromagnetic wave shielding material is laminated on one side or both sides of the circuit board to shield it from electromagnetic noise generated from other electronic parts. Since there is a limit to built-in volume, the electromagnetic wave shield is required, for example, not to impair the flexibility of the board and electromagnetic wave shielding performance. However, only metallic leaf and wire gauze can be used in the existing circumstances. So, the flexibility of the shielding materials remains unsatisfactory under such circumstances.

By way of example, metallic leaf include stainless steel leaf, aluminum leaf, copper leaf and gold leaf. A sheet-like leaf 50 μm or smaller in thickness may be produced. However, it is desired to replace the metallic leaf with other materials because the weight of a part coated with metallic leaf becomes heavy due to its great specific gravity. Moreover, metallic leaf has poor in processability, and its cost is comparatively high. On the other hand, wire gauze is porous compared with metallic leaf. Also, the exposed surface area of a sheet composed of the wire gauze is greater than the metallic leaf. Therefore, wire gauze has the advantage of enabling it to lighten the whole weight without impairing the electromagnetic wave shielding performance. However, a monofilament thinner than 50 μm in diameter cannot be obtained. So, it is difficult to obtain a wire gauze having a thickness thinner than 100 μm even with plain weave processing. Therefore, wire gauze presents problems with respect to thickness and flexibility of the shielding element.

SUMMARY OF THE INVENTION

The present invention has been made in view of the foregoing circumstances in the prior art. It is thus an object of the present invention to provide a thin and flexible electromagnetic wave shielding material having excellent shielding properties and mainly usable in electronic equipment.

According to the present invention, there is thus provided an electromagnetic wave shielding sheet composed of a porous sheet containing one or plural kinds of metallic fibers, wherein the sheet has a thickness of 10 to 100 μm, a porosity of 70 to 95% and Gurley stiffness of 5 to 50 mg.

In the electromagnetic wave shielding sheet according to the present invention, the porous sheet may be formed of a sintered body of the metallic fibers.

In the electromagnetic wave shielding sheet according to the present invention, the surfaces of the metallic fibers may be coated with a metallic material having a resistivity lower than the metallic fibers making up the porous sheet.

In the electromagnetic wave shielding sheet according to the present invention, the metallic fibers come into contact with each other and are mutually fusion-bonded to each other by sintering, so that a thin and flexible porous sheet having excellent electromagnetic wave shielding properties is obtained.

DETAILED DESCRIPTION OF PREFERRED EMBODIMENTS

Figure 1:
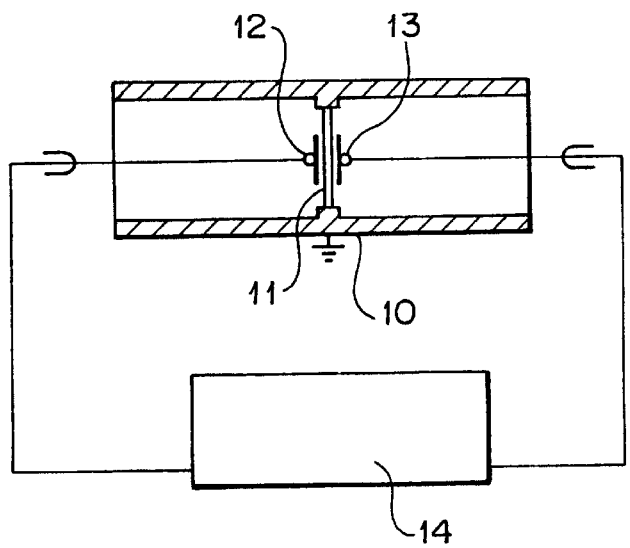
FIG. 1 schematically illustrates the construction of an apparatus used in the measurement of a shielding effect against electromagnetic waves.

The material for making a porous sheet according to the present invention may be a metallic material that is either magnetic or non-magnetic. However, it is preferably a metal having high magnetism permeability for the purpose of shielding in a high frequency region. Examples of metallic fibers useful in the practice of the present invention include stainless steel fiber, nickel fiber, copper fiber, aluminum fiber, silver fiber, gold fiber and titanium fiber which can be processed into an extremely small-gage wire. However, any metal may be used without any limitation on its kind so far as it is a metal which is electroconductive and which is capable of processing into a small-gage wire. When these metallic fibers are each formed into a sheet, the flexibility of the sheet becomes better as its fiber diameter is smaller, so that the measured value of Gurley stiffness can be further reduced. However, processing becomes harder as the diameter of fiber is smaller, which is disadvantageous from the viewpoint of cost. Therefore, the fiber diameter is selected from the range of generally from 5 to 50 μm, preferably 20 μm or smaller as necessary for the end application intended. No particular limitation is imposed on the length of the metallic fiber. When the sheet is made in accordance with a wet paper making process, however, it is most preferred that the length should fall within a range of from 2 to 6 mm. Since the shielding against electromagnetic waves with a metallic material is mainly by virtue of reflection, it is considered that a shielding effect per unit volume becomes greater as an exposed surface is wider. Also, its heat radiating ability is improved. As the exposed surface area of a porous sheet becomes wider, the number of pores in the sheet is greater, the individual pore sizes are smaller, and the diameter and length of fibers making up the sheet are smaller. Thus, it is preferred to form a sheet by suitably selecting and adjusting these conditions.

The production of the porous sheet is preferably conducted in accordance with a wet paper making process. However, the sheet may also be obtained by a method for producing braid or woven fabric. For example, one kind of metallic fibers or different kinds of metallic fibers are cut into short fibers and are dispersed in water. A proper amount of a binder and optional auxiliaries are added to the dispersion to form a mixture. The mixture is subjected to a dehydration treatment on a wire, hot pressed and dried to form a sheet. The sheet is heated under vacuum or in a non-oxidizing atmosphere to pyrolytically decompose the binder and the like, thereby removing them.

For example, polyvinyl alcohol fiber, polyethylene fiber, polypropylene fiber, cellulose pulp or the like may be used as the binder. A dispersing agent, surfactant, antifoaming agent and the like, which are commonly used in the wet paper making process, may be used as the auxiliaries. Argon gas, nitrogen gas, hydrogen gas or the like may be used in the non-oxidizing atmosphere.

The metallic fibers in the porous sheet may also be mutually sintered for purposes of electromagnetic wave shielding properties and to improve quality. Sintering may preferably be carried out by heating the porous sheet at a temperature near the melting point of the metallic fibers under vacuum or in a non-oxidizing atmosphere. For example, in the case of stainless steel fiber, the sheet is sintered at 1,120° C. for 1 to 2 hours.

In the present invention, the surfaces of the metallic fibers of the porous sheet may be coated with a metal having a resistivity lower than the metallic fibers so that the desired electrical conductivity and other characteristics or properties may be attained with a less amount of the metal, thereby achieving an excellent shielding effect against electromagnetic waves.

Coating the metallic fiber surface can be accomplished by any known method such as electroplating, electroless plating, sputtering, vapor deposition or by a plasma spray coating process. Alternatively, sintering may be conducted while causing fiber of another low-resistive metal having a melting point lower than the metallic fiber to coexist, thereby coating the surface of the metallic fiber with the low-resistive metal at the same time as the sintering.

The porous sheet obtained by any of the aforementioned processes must have a thickness of 10 to 100 μm, a porosity of 70 to 95% and Gurley stiffness of 5 to 50 mg. The thickness is limited to the range of from 10 to 100 μm because the volume occupied by each electronic part tends to become smaller. Further, when the porous sheet is used for a flexible printed circuit board or the like, it must have good flexibility. For these reasons, the above parameters are required to be within the aforementioned respective ranges.

More specifically, if the thickness is greater than the upper limit of the above range, the occupied volume of the part naturally increases, and the Gurley stiffness of the resulting sheet is increased. If the thickness is smaller than 10 μm on the other hand, the strength of the resulting sheet is lowered, and so its durability becomes poor, and its shielding effect against electromagnetic waves is also lowered.

If the porosity are lower than 70%, the density of the resulting sheet becomes too high, its flexibility is lowered, and its Gurley stiffness is increased. If the porosity are higher than 95% on the other hand, fewer fibers make up the resulting sheet, and so the strength of the sheet and its electromagnetic wave shielding performance are lowered.

If the Gurley stiffness is lower than 5 mg, the resulting sheet becomes too flexible and it deteriorates when handled during processing. On the other hand, if the Gurley stiffness is higher than 50 mg, the flexibility of the resulting sheet is deteriorated.

In the present invention, the porosity and Gurley stiffness are values determined by the following respective measuring methods.

(Porosity)

The porosity value indicates the degree of porosity in a porous sheet and is determined in accordance with the following equation:

$$\text{Porosity } (\%) = \{1-(\text{Apparent density of sheet/True density of sheet})\} \times 100$$

In the equation, the apparent density of the sheet is a value calculated out from the basis weight and thickness of the sheet. The true density of the sheet means a density of the fiber itself (including a coating metal if any).

(Measurement of Gurley stiffness)

The measurement of the stiffness is conducted by using a Gurley stiffness tester (manufactured by Kumagai Riki Kogyo K.K.) and applying an appropriate load to a specimen 2 inches wide and 1–5 inches long at an appropriate loading position (L1, L2 and L4 indicate positions 1 inch, 2 inches and 4 inches distant from a pivot in the center of a pendulum, respectively). A value of the scale thus obtained is substituted for the following equation to calculate out the stiffness (mg) when a standard specimen (1 inch wide and 3.5 inches long; applying a load of 5 g at a loading position of 1 inch) is used.

$$\text{Gurley stiffness (mg)} = Rg \times \frac{W1 \times 1 + W2 \times 2 + W4 \times 4}{5} \times \frac{L^2}{W} \times 19.8$$

wherein

Rg: scale reading;

W: width of specimen (inches);

L: length of specimen (inches); and

W1, W2 and W4: weight (g) of weights used at the respective loading positions Li, L2 and L4.

The electromagnetic wave shielding sheets according to the present invention are thin in thickness and lighter in weight, have excellent flexibility and exhibit a good shielding effect against electromagnetic waves. Accordingly, the electromagnetic wave shielding sheets according to the present invention are extremely useful for shielding of lighter and miniaturized electronic equipment from electromagnetic waves.

EXAMPLES

Example 1

A sheet was made from a slurry composed of 95 parts by weight of stainless steel fiber (material: SUS316L; trade name: SUSMIC; product of Tokyo Rope Mfg. Co., Ltd.) having a fiber diameter of 8 μm and a fiber length of 4 mm, and 5 parts by weight of polyvinyl alcohol fiber (trade name: Fibribond VPB105-1; product of Kuraray Co., Ltd.; the dissolving temperature in water: 70° C.) in accordance with a wet paper making process. The resultant wet sheet was subjected to dehydrating press and dried by heating to obtain a dry sheet having a basis weight of 62 g/m². The sheet thus obtained was hot press-bonded under conditions of a linear pressure of 300 kg/cm and a take-off speed of 5 m/min by means of heated rolls having a surface temperature of 160° C. to obtain a hot press-bonded stainless steel fiber sheet. The shielding effect of the resultant sheet against electromagnetic waves was determined and evaluated. This sheet was thin in thickness because it had been subjected to the hot press bonding and the sheet was flexible. Moreover, the sheet had a high shielding effect against electromagnetic waves because its interfiber distance was shortened by the hot press bonding.

Example 2

A sheet obtained in accordance with the wet paper making process set forth in Example 1 was subjected to a sintering treatment in a continuous sintering furnace (a brazing furnace equipped with a mesh belt in a hydrogen atmosphere at a temperature of 1,120° C. and at a take-off speed of 15 cm/mm without conducting the hot press bonding. The product obtained was a sintered stainless steel fiber sheet having a basis weight of 45 g/m². The shielding effect of the thus-obtained sheet against electromagnetic waves was determined and evaluated in the same manner as in Example 1. This sheet was free from the stiffness attributable to the binder by virtue of the degreasing effect and bonding between the metallic fibers by the sintering. Thus the sheet was flexible. In addition, the sheet had a high shielding effect against electromagnetic waves because the metallic fibers were directly bonded to each other.

Example 3

A sintered stainless steel fiber sheet having a basis weight of 80 g/m² was obtained in accordance with the production process for preparing the sintered stainless steel fiber sheet in Example 2 except for the basis weight. The shielding effect of the thus-obtained sheet against electromagnetic waves was determined and evaluated in the same manner as in Example 1. This sheet was increased in stiffness value by the increment of the basis weight compared with the sheet in Example 2, and so its flexibility was comparatively poor. However, the metallic fibers were directly bonded to each other by virtue of the bonding between the metallic fibers by the sintering and the increase in metallic fiber content. Thus the sheet had a high shielding effect against electromagnetic waves.

Example 4

A sheet was made from a slurry composed of 60 parts by weight of stainless steel fiber (material: SUS316L; trade name: SUSMIC; product of Tokyo Rope Mfg. Co., Ltd.) having a fiber diameter of 8 μm and a fiber length of 4 mm, 20 parts by weight of copper fiber (trade name: Coplon, product of Esco Co.) having a fiber diameter of 30 μm and a fiber length of 4 mm and 20 parts by weight of polyvinyl alcohol fiber (trade name: Fibribond VPB105-1; product of Kuraray Co., Ltd.; the dissolving temperature in water: 70° C.) in accordance with a wet paper making process. The resultant wet sheet was subjected to a dehydrating press and dried by heating to obtain a dry sheet having a basis weight of 75 g/m². The sheet thus-obtained was hot press-bonded under conditions of a linear pressure of 300 kg/cm and at a take-off speed of 5 m/min by means of heated rolls having a surface temperature of 160° C. The thus-obtained hot press-bonded metallic fiber sheet was subjected to a sintering treatment in a continuous sintering furnace (a brazing furnace equipped with a mesh belt) at a temperature of 1,120° C. and at a take-off speed of 15 cm/min in a hydrogen atmosphere. The product obtained was a sintered metallic fiber sheet having a basis weight of 60 g/m², in which the surface of the stainless steel fiber was coated with copper by fusion bonding. The shielding effect of the thus-obtained sheet against electromagnetic waves was determined and evaluated in the same manner as in Example 1. This sheet was thin in thickness because it had been subjected to the hot press bonding, and was free from the stiffness attributable to the binder and thickness by virtue of the degreasing effect and bonding between the metallic fibers by the sintering. Thus the sheet was flexible. In addition, the sheet had a high shielding effect against electromagnetic waves because the metallic fibers were directly bonded to each other and because the stainless steel fiber was coated with copper having a resistivity lower than the stainless steel.

Comparative Example 1

A sintered stainless steel fiber sheet having a basis weight of 32 g/m² was obtained in the same manner as the production process of the sintered stainless steel fiber sheet in Example 2 except for the basis weight. The shielding effect of the thus-obtained sheet against electromagnetic waves was determined and evaluated in the same manner as in Example 1. This sheet had an increase in stiffness value compared with the sheet in Example 1 because no hot press bonding was conducted, and so its flexibility was poor. Further, its interfiber distance was long due to high porosity, and so its shielding effect against electromagnetic waves was poor.

Comparative Example 2

An aluminum leaf having a thickness of 27 μm was used as a comparative electromagnetic wave shielding material to determine and evaluate the shielding effect of the leaf against electromagnetic waves in the same manner as in Example 1. The aluminum leaf had a high shielding effect on the electromagnetic waves. However, its stiffness depended on the nature and thickness of the metal itself, and so it was difficult to achieve high flexibility.

Comparative Example 3

A 200-mesh wire gauze made of stainless steel was used as a comparative electromagnetic wave shielding material to determine and evaluate the shielding effect of the wire gauze against electromagnetic waves in the same manner as in Example 1. The wire gauze achieved a shielding effect on the electromagnetic waves due to its high fiber density, but was lacking in flexibility. In addition, the low fiber density of the wire woven gauze resulted in a poor shielding effect against electromagnetic waves due to its large mesh size.

The physical properties and evaluation results of the electromagnetic wave shielding materials in the above-described Examples and Comparative Examples are shown collectively in the following Table 2. In Table 2, the thickness and density, and the basis weight were measured in accordance with JIS P 8118 and JIS P 8124, respectively. The evaluation of Gurley stiffness and shielding effect against electromagnetic waves was conducted in the following measuring method.

(Measurement of Gurley stiffness)

The Gurley stiffness was measured according to the above described method. The loading position in each sheet of Examples 1–4 and Comparative Examples 1–3 and the load thereof are shown in Table 1.

TABLE 1

|  | Ex. 1 | Ex. 2 | Ex. 3 | Ex. 4 | Comp. Ex. 1 | Comp. Ex. 2 | Comp. Ex. 3 |
|---|---|---|---|---|---|---|---|
| Loading position | L1 | L2 | L2 | L2 | L2 | L2 | L4 |
| Load (g) | 5 (W1) | 5 (W2) | 5 (W2) | 5 (W2) | 5 (W2) | 25 (W2) | 25 (W4) |

(Measurement of shielding properties)

The measurement of shielding properties for evaluating the shielding effect against electromagnetic waves was conducted by means of TR17301 and TR4172 manufactured by ADVANTEST CORP. illustrated in FIG. 1. In FIG. 1, reference numeral 10 indicates a shield box (TR17301) in which a transmitting antenna 12 and receiving antenna 13 are arranged. A specimen 11 15-cm square is set in a metallic holder between both antennas. Reference numeral 14 indicates a spectrum analyzer (TR4172). The measurement of electric wave and magnetic wave shielding properties was conducted by using attached rod antenna (for electric waves) and loop antenna (for magnetic waves) to determine respective shielding properties in a frequency region of from 10 to 1,000 MHz.

Figure 2:
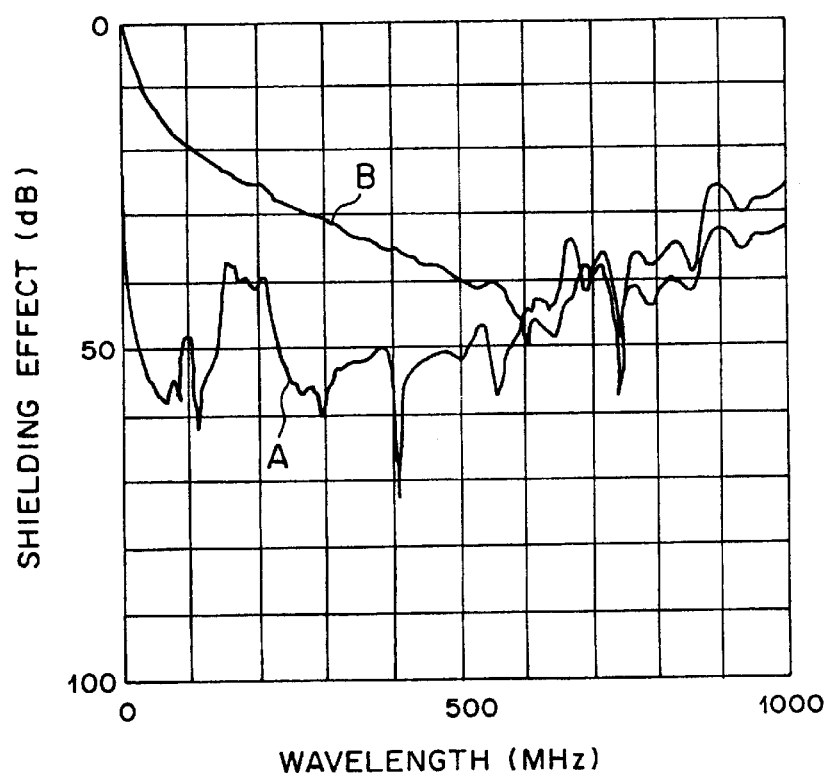
FIG. 2 diagrammatically illustrates the relationship between frequency and shielding effect as to electric waves and magnetic waves. In the FIG. 2, A means electric waves and B means magnetic waves.

The shielding properties illustrated in Table 2 are values obtained from a chart recorded in the spectrum analyzer, which indicate values of the shielding effects at the frequency of 500 MHz. For example, in the case of the sheet in Example 2, the values of shielding effects against an electric wave and a magnetic wave at a frequency of 500 MHz were 51 dB and 40 dB, respectively. The data obtained is summarized in FIG. 2 in which shielding effects (ordinate axis) on both electric and magnetic waves versus frequency (abscissa axis). Label A represents the electric waves while label B represents the magnetic waves.

TABLE 2

|  | Ex. 1 | Ex. 2 | Ex. 3 | Ex. 4 | Comp. Ex. 1 | Comp. Ex. 2 | Comp. Ex. 3 |
|---|---|---|---|---|---|---|---|
| Thickness ($\mu$m) | 28 | 62 | 100 | 25 | 100 | 27 | 116 |
| Basis weight (g/m$^2$) | 62 | 45 | 80 | 60 | 32 | 68 | 255 |
| Apparent density (g/cm$^3$) | 2.2 | 0.7 | 0.8 | 2.4 | 0.3 | 2.5 | 2.2 |
| Porosity (%) | 72 | 91 | 90 | 71 | 96 | 0 | 72 |
| Gurley stiffness (mg) | 12 | 10 | 41 | 17 | 45 | 72 | 324 |
| Shielding property Elec. wave (dB) | 50 | 51 | 58 | 61 | 18 | 69 | 54 |
| Magn. wave (dB) | 37 | 40 | 47 | 57 | 2 | 70 | 53 |
| Shielding effect on electromagnetic waves | ○ | ○ | ○ | ○ | X | ○ | ○ |
| Overall evaluation | ○ | ○ | ○ | ○ | X | X | X |

In the above table, the evaluation standard is as follows:
Shielding effect on electromagnetic waves:
  ○: acceptable level; and
  X: poor.
Overall evaluation:
  ○: acceptable level; and
  X: impracticable.

What is claimed is:

1. An electromagnetic wave shielding sheet composed of a porous sheet containing one or plural kinds of metallic fibers, wherein the sheet has a thickness of 10 to 28 $\mu$m, a porosity of 70 to 95% and Gurley stiffness of 5 to 17 mg.

2. The electromagnetic wave shielding sheet according to claim 1, wherein the porous sheet is a sintered porous sheet formed of a sintered body of the metallic fibers.

3. The electromagnetic wave shielding sheet according to claim 1, wherein the surfaces of the metallic fibers are coated with a metallic material having a resistivity lower than the metallic fibers making up the porous sheet.

* * * * *